US008820966B2

(12) United States Patent
Igaki et al.

(10) Patent No.: US 8,820,966 B2
(45) Date of Patent: Sep. 2, 2014

(54) LED LIGHT BULB

(75) Inventors: Masaru Igaki, Kyoto (JP); Akio Yabugami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 71 days.

(21) Appl. No.: 13/358,117

(22) Filed: Jan. 25, 2012

(65) Prior Publication Data

US 2012/0188767 A1    Jul. 26, 2012

(30) Foreign Application Priority Data

Jan. 26, 2011  (JP) ................................. 2011-014608

(51) Int. Cl.
  *F21V 14/00*  (2006.01)
(52) U.S. Cl.
  USPC ...... 362/256; 362/249.04; 362/363; 362/294; 362/373
(58) Field of Classification Search
  USPC .............. 362/218, 249.01, 249.02, 255, 256, 362/294, 373, 646, 650
  See application file for complete search history.

(56) References Cited

U.S. PATENT DOCUMENTS

| 3,067,352 | A | * | 12/1962 | Vodicka et al. ............... 313/116 |
| 3,634,679 | A | * | 1/1972 | Krzyston ........................ 40/431 |
| 5,434,765 | A | * | 7/1995 | Kelly et al. ................... 362/271 |
| 5,806,965 | A | * | 9/1998 | Deese ...................... 362/249.04 |
| 6,314,555 | B1 | * | 11/2001 | Ndumu et al. ................. 717/101 |
| 6,517,217 | B1 | * | 2/2003 | Liao ............................. 362/235 |
| 6,523,978 | B1 | * | 2/2003 | Huang ..................... 362/249.04 |
| 6,709,132 | B2 | * | 3/2004 | Ishibashi ....................... 362/235 |
| 7,744,251 | B2 | * | 6/2010 | Liu et al. ....................... 362/294 |
| 7,956,546 | B2 | * | 6/2011 | Hasnain .................... 315/200 R |
| 8,047,688 | B2 | * | 11/2011 | Takahasi et al. .............. 362/310 |
| 8,125,126 | B2 | * | 2/2012 | Lin et al. ......................... 313/46 |
| 8,246,215 | B2 | * | 8/2012 | Lu et al. ........................ 362/294 |
| 8,371,722 | B2 | * | 2/2013 | Carroll .................... 362/311.02 |
| 8,439,527 | B2 | * | 5/2013 | Takahasi et al. .............. 362/310 |
| 2003/0031015 | A1 | * | 2/2003 | Ishibashi ....................... 362/249 |
| 2005/0174769 | A1 | * | 8/2005 | Yong et al. .................... 362/235 |
| 2006/0193130 | A1 | * | 8/2006 | Ishibashi ....................... 362/227 |
| 2009/0016063 | A1 | * | 1/2009 | Hu ................................ 362/294 |
| 2010/0061495 | A1 | * | 3/2010 | Cho et al. ...................... 375/346 |
| 2010/0172133 | A1 | * | 7/2010 | Liu ............................... 362/235 |
| 2011/0204393 | A1 | * | 8/2011 | Masumoto et al. ............. 257/88 |
| 2012/0287652 | A1 | * | 11/2012 | Breidenassel et al. ........ 362/373 |

FOREIGN PATENT DOCUMENTS

| JP | 2010-135308 | 6/2010 |
| JP | 2010-135309 | 6/2010 |

* cited by examiner

*Primary Examiner* — John A Ward
(74) *Attorney, Agent, or Firm* — Hamre, Schumann, Mueller & Larson, P.C.

(57) ABSTRACT

The present invention provides a LED light bulb which is capable of providing the gorgeous and artistic impressions. The LED light bulb comprises a plurality of LED chips, a globe covering the LED chips and allowing the light emitted from the LED chips to penetrate, and a bulb connector, wherein at least one portion of the globe has a concave-convex part.

22 Claims, 9 Drawing Sheets

LED LIGHT BULB

BACKGROUND OF THE INVENTION

1. Field of the Invention

The present invention relates to a LED (Light Emitting Diode) light bulb, which uses the LED chips as the light source.

2. Description of the Related Art

The LED light bulb which has installed the LED chips, regarded as a substitute product of so-called incandescent light bulb, has begun to popularize. Relative to the incandescent light bulb, the LED light bulb has certain advantages of saving electricity and long life-span.

FIG. 12 illustrates an example of the conventional LED light bulb (for example, referring to Patent Documents 1 and 2). The LED light bulb 900 shown in FIG. 12 includes a plurality of LED modules 901, a globe 902, a heat dissipation component 903 and a bulb connector 904. The LED module 901 is a light emitting apparatus of the LED light bulb 900, which has disposed the LED chips (not shown in the drawings). The globe 902 allows the light emitted from the LED modules 901 to diffuse and penetrate. The heat dissipation component 903 is used to disperse the heat generated from the LED modules 901, for example, which contains aluminum (Al). The bulb connector 904 is a part used to install the LED light bulb 900 on a lighting appliance used for the incandescent light bulb. The LED light bulb 900 is expected to present an appearance similar to the incandescent light bulb by allowing the globe 902 to luminesce uniformly while turning the bulb on.

For example, the indoor lighting has a chandelier. The chandelier performs the indoor lighting and is expected to provide the gorgeous and artistic impressions through its' shape or the light emitting manner. In order to enable the LED light bulb 900 to provide the same impressions, the lighting appliance (not shown in the drawings) which has installed the LED light bulb 900 must be set to a constitution that is similar to the chandelier and is capable of providing the gorgeous impression.

Patent Document 1: Japanese Patent Publication No. 2010-135308; Patent Document 2: Japanese Patent Publication No. 2010-135309.

SUMMARY OF THE INVENTION

The present invention has been proposed under the circumstances described above. The present invention provides a LED light bulb which is capable of providing the gorgeous and artistic impressions.

A LED light bulb according to the present invention comprises a plurality of LED chips, a globe covering the LED chips and allowing the light emitted from the LED chips to penetrate, and a bulb connector, wherein at least one portion of the globe has a concave-convex part.

Preferably in one embodiment of the present invention, the globe has a plurality of strip bulging portions to constitute the concave-convex part.

Preferably in one embodiment of the present invention, the globe has an opening located on the same side as the bulb connector and a top located on the opposite side from the bulb connector; the strip bulging portions extend from the opening to the top.

Preferably in one embodiment of the present invention, the strip bulging portions are adjacent to each other.

Preferably in one embodiment of the present invention, each of the strip bulging portions has a partial-circle shaped cross-section.

Preferably in one embodiment of the present invention, the concave-convex part is located on an inner side of the globe.

Preferably in one embodiment of the present invention, the LED light bulb according the present invention further comprises a heat conductive bracket supporting the LED chips and a heat dissipation component on which the heat conductive bracket and the bulb connector are installed opposite to each other.

Preferably in one embodiment of the present invention, the heat conductive bracket has a circular top plate and a first cylinder portion connected to the top plate.

Preferably in one embodiment of the present invention, a diameter of the first cylinder portion becomes increasingly smaller toward the top plate.

Preferably in one embodiment of the present invention, the LED light bulb according the present invention further comprises a flexible circuit substrate that carries the LED chips and is installed on the heat conductive bracket.

Preferably in one embodiment of the present invention, the flexible circuit substrate has a circular portion to be installed on the top plate.

Preferably in one embodiment of the present invention, the flexible circuit substrate has a first strip arc portion to be installed on the first cylinder portion.

Preferably in one embodiment of the present invention, the heat conductive bracket has a first groove located between a surface of the top plate and a surface of the first cylinder portion; the flexible circuit substrate has a first connection portion connected to the circular portion and the first strip arc portion, and a first insulation ring disposed in the first groove and located between the first connection portion of the flexible circuit substrate and the heat conductive bracket.

Preferably in one embodiment of the present invention, the globe has a first diffusion-penetration portion formed on a position facing a boundary between the top plate and the first cylinder portion, which allows the light emitted from the LED chips to diffuse and penetrate.

Preferably in one embodiment of the present invention, the heat conductive bracket has a second cylinder portion connected to the opposite side of the first cylinder portion from the top plate, and a diameter of the second cylinder portion becomes increasingly smaller toward the first cylinder portion; the flexible circuit substrate has a second strip arc portion installed on the second cylinder portion.

Preferably in one embodiment of the present invention, the heat conductive bracket has a circular flange plate installed on the heat dissipation component.

Preferably in one embodiment of the present invention, the heat conductive bracket has a non-carrier cylinder portion located between the flange plate and the first cylinder portion, and the flexible circuit substrate is not installed thereon.

Preferably in one embodiment of the present invention, the heat conductive bracket has a base cylinder portion located between the flange plate and the non-carrier cylinder portion, and a diameter of the base cylinder portion becomes increasingly smaller from the flange plate toward the non-carrier cylinder portion.

Preferably in one embodiment of the present invention, the LED light bulb according the present invention further comprises a plurality of LED modules installed on the flexible circuit substrate, each of which comprises the LED chip.

Preferably in one embodiment of the present invention, in the plurality of LED modules, the LED modules installed on the first strip arc portion are disposed in multi-line.

Preferably in one embodiment of the present invention, in the plurality of LED modules, the LED modules installed on the first strip arc portion are disposed in a staggered arrangement.

Preferably in one embodiment of the present invention, the globe has a cylinder portion surrounded at least one portion of the heat conductive bracket and a dome portion connected to the cylinder portion.

According to the above constitution, while the light emitted from the LED chips penetrates the concave-convex part of the globe, the entire globe in uniform luminescence cannot be observed from the outside of the globe, but the globe intermixed the bright and dark portions can be observed. Consequently, it is capable of allowing the LED light bulb to have the glitter sense, thereby providing the gorgeous and artistic impressions.

Other features and advantages of the present invention will become more apparent from the detailed descriptions given below with reference to the accompanying drawings.

DETAILED DESCRIPTION OF THE INVENTION

Hereinafter, the preferred embodiments of the present invention will be described in detail with reference to the accompanying drawings.

Figure 1:
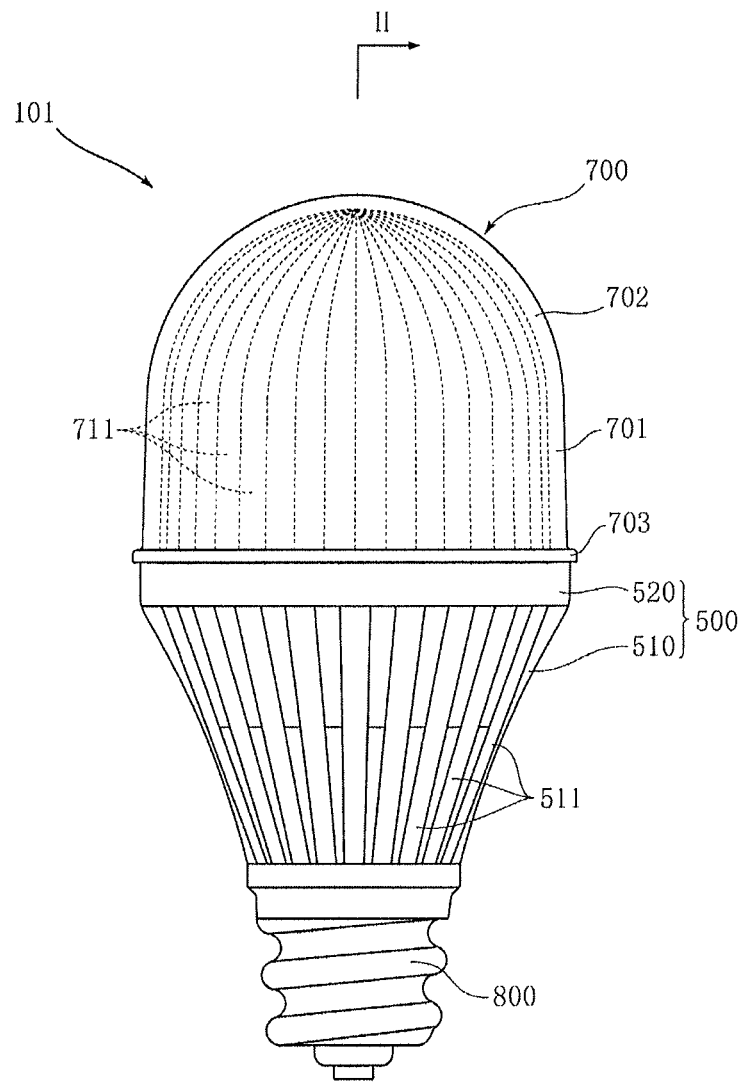
FIG. 1 is a front elevation view of a LED light bulb according to a first embodiment of the present invention.
Figure 2:
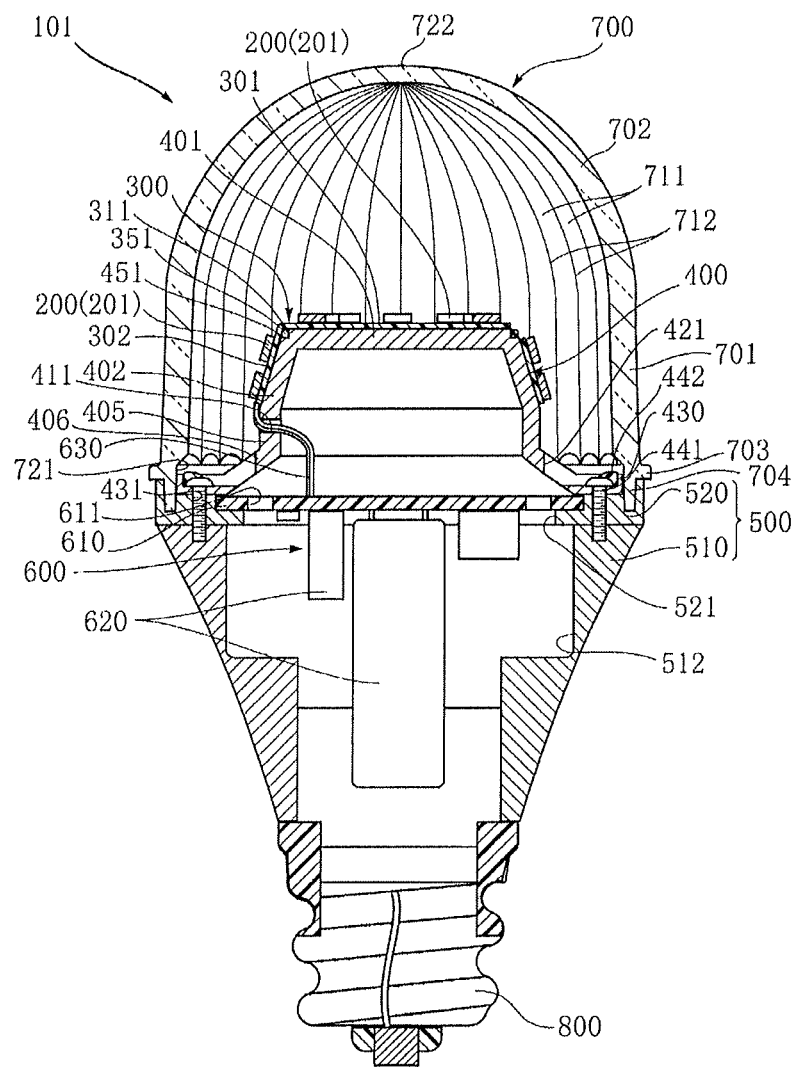
FIG. 2 is a sectional view taken along lines II-II of FIG. 1.
Figure 3:
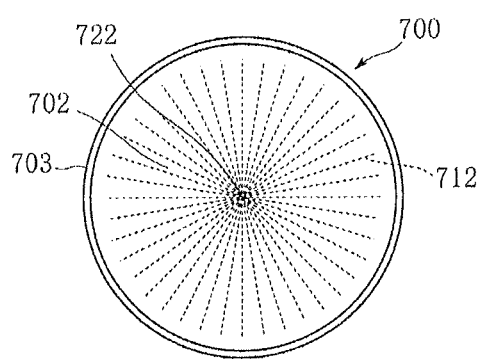
FIG. 3 is a plane view of a globe of the LED light bulb shown in FIG. 1.
Figure 4:
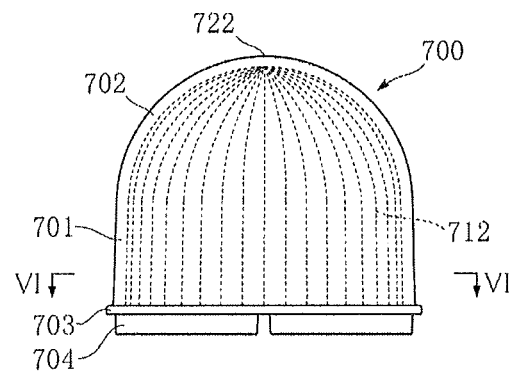
FIG. 4 is a front elevation view of the globe of the LED light bulb shown in FIG. 1.
Figure 5:
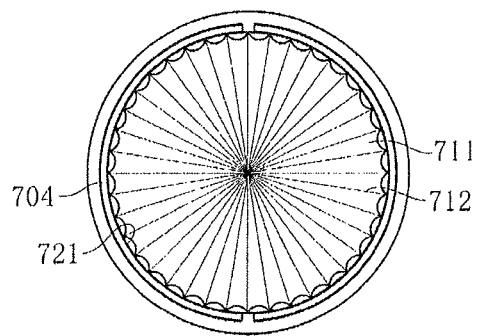
FIG. 5 is a bottom view of the globe of the LED light bulb shown in FIG. 1.
Figure 6:
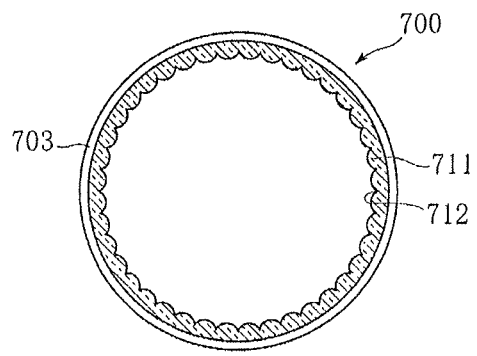
FIG. 6 is a sectional view taken along lines VI-VI of FIG. 4.

FIGS. 1 and 2 illustrate a LED light bulb according to a first embodiment of the present invention. The LED light bulb 101 of the present embodiment includes a plurality of LED modules 200, a flexible circuit substrate 300, a heat conductive bracket 400, a heat dissipation component 500, a power source portion 600, a globe 700 and a bulb connector 800. The LED light bulb 101 regarded as a substitute product of an incandescent light bulb is installed and used on a lighting appliance used for the incandescent light bulb. For example, the LED light bulb 101 is formed in the same size as a 60-Watt bulb, which has a diameter around 55 mm and a height around 108 mm.

Figure 7:
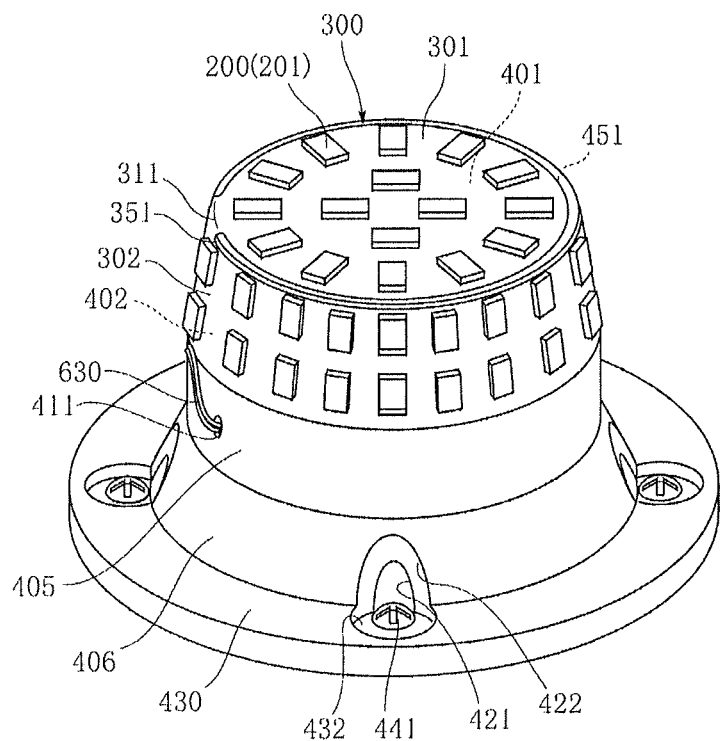
FIG. 7 is a perspective view of a heat conductive bracket of the LED light bulb shown in FIG. 1.

The flexible circuit substrate 300 is used to support the plurality of LED modules 200 and provides a power source supplying path toward the LED modules. In the present embodiment, the flexible circuit substrate 300 has a resin layer and a metal layer used to constitute a circuit pattern (not shown in the drawings), and also has a circular portion 301, a first strip arc portion 302, and a first connection portion 311, as shown in FIG. 7. The circular portion 301 is approximately circular in shape. The first strip arc portion 302 is curved to an arc shape in a length direction and has a certain width. The first connection portion 311 connects to the circular portion 301 and the first strip arc portion 302.

As illustrated in FIGS. 2 and 7, the plurality of LED modules 200 are installed on the circular portion 301 and the first strip arc portion 302 of the flexible circuit substrate 300. In the plurality of LED modules 200, the LED modules installed on the circular portion 301 includes a portion disposed in a circular shape along an outer edge of the circular portion 301, and another portion surrounded by the above portion and disposed on a position near a center of the circular portion 301. In the plurality of LED modules 200, the LED modules installed on the first strip arc portion 302 are disposed in two-line on the length direction of the first strip arc portion 302.

Figure 8:
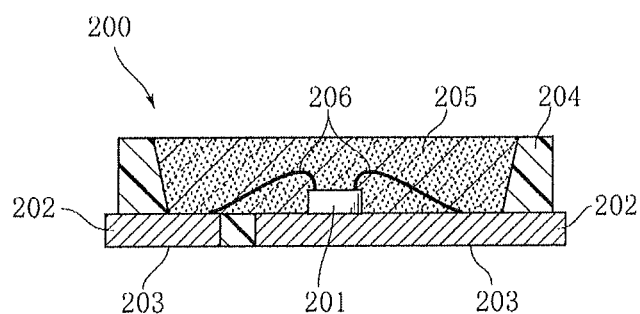
FIG. 8 is a sectional view of a LED module of the LED light bulb shown in FIG. 1.

As illustrated in FIG. 8, the LED module 200 includes a LED chip 201, a pair of leads 202, a casing 204, a sealing resin 205, and two wires 206. The pair of leads 202, for example, contain Cu alloy, and one of the leads carries the LED chip 201. A surface opposite to the surface for carrying the LED chip 201 is set as an installation terminal 203 used to perform a surface installation for the LED module 200. The LED chip 201 is a light source of the LED module 200, for example, which is capable of emitting a blue light. The sealing resin 205 is used to protect the LED chip 201. The sealing resin 205 is formed by using a transparent resin which contains a fluorescent matter. The fluorescent matter is excited through the light emitted from the LED chip 201, thereby emitting a yellow light. In the fluorescent matter, the matter emitted the yellow light can be replaced with a mixture of two matters capable of emitting a red light and a green light, respectively. The casing 204, for example, which contains a white resin, is used to reflect the light emitted from the LED chip 201 toward a side direction upward.

In another embodiment, the LED chip 201 can be directly installed on the flexible circuit substrate 300.

As illustrated in FIGS. 2 and 7, the heat conductive bracket 400 is used to support the flexible circuit substrate 300 and conducts the heat generated from the flexible circuit substrate 300 to the heat dissipation component 500. The heat conductive bracket 400 has a top plate 401, a first cylinder portion 402, a non-carrier cylinder portion 405, a base cylinder portion 406, and a flange plate 430. The material of the heat conductive bracket 400 is preferably a high thermal conductivity material, such as aluminum and so on.

The top plate 401 is circular in shape and the circular portion 301 of the flexible circuit substrate 300 is installed thereon through an adhesive or a double-sided tape. The first cylinder portion 402 connects to the top plate 401 and is conical in shape, wherein its diameter becomes increasingly smaller toward the top plate 401. The first strip arc portion 302 of the flexible circuit substrate 300 is installed on the first cylinder portion 402. A first groove 451 is formed between a surface of the top plate 401 and a surface of the first cylinder portion 402. A first insulation ring 351 is disposed in the first groove 451. The first insulation ring 351, for example, which contains resin, is located between the first connection portion 311 of the flexible circuit substrate 300 and the heat conductive bracket 400.

The non-carrier cylinder portion 405 connects to the first cylinder portion 402 and has a cylinder shape with an approximately fixed diameter. The flexible circuit substrate 300 is not installed on the non-carrier cylinder portion 405. The non-carrier cylinder portion 405 has a wiring through hole 411 formed thereon. The base cylinder portion 406 connects to the non-carrier cylinder portion 405 and is conical in shape, wherein its diameter becomes increasingly smaller toward the non-carrier cylinder portion 405. The flange plate 430 extends outward from the base cylinder portion 406 and is a circular ring in shape.

As illustrated in FIG. 7, the base cylinder portion 406 has four heat dissipation through holes 421 formed thereon. The outside and inside spaces of the heat conductive bracket 400 communicate to each other through the heat dissipation through holes 421. Four screw through holes 431 and four counterbores 432 are formed on the flange plate 430. The screw through hole 431 allows a screw 441 that fixes the heat conductive bracket 400 on the heat dissipation component 500 to penetrate. In the present embodiment, the screw through holes 431 are disposed by using an interval of 90°. The counterbore 432 is used to allow a head of the screw 441 to sink in the flange plate 430, and which is a circular cavity and its diameter is greater than that of the screw through hole 431. When a drill machining used to form the counterbore 432 is performed, the flange plate 430 and a part of the base cylinder portion 406 are cut, thereby forming four breaches 422 on the heat conductive bracket 400. A penetrated portion of the breach 422 on a thickness direction of the base cylinder portion 406 becomes the heat dissipation through hole 421. The result means that the other portion of the breach 422 constitutes the counterbore 432. The counterbore 432 is filled with a fixing resin 442 used to prevent the screw 441 from being loosened In the present embodiment, the fixing resin 442 fills an approximately half region of the counterbore 432 that is located on the opposite side from the base cylinder portion 406.

As illustrated in FIGS. 1 and 2, the heat dissipation component 500 has installed the heat conductive bracket 400, and which includes a main body 510 and a spacer 520 in the present embodiment. The material of the heat dissipation component 500 is preferably a high thermal conductivity material, such as aluminum and so on. In another embodiment, the heat dissipation component 500 can be formed as a uniboby.

The main body 510 is a trumpet in shape and has a plurality of fins 511. The fins 511 are outwardly formed in a radial shape. The main body 510 has a power source accommodating cavity 512 formed thereon. The power source accommodating cavity 512 accommodates at least one portion of the power source portion 600, in the present embodiment, which accommodates the most power source portion 600. The spacer 520 is a circular plate in shape and is installed on a top end of the main body 510. The spacer 520 has an opening 521 formed thereon. The opening 521 is disposed to avoid an interference occurred with the power source portion 600.

The power source portion 600 generates a DC power, that is suitable to turn the LED module 200 (the LED chip 201) on, from a commercial AC power source of 100 V, and supplies the DC power to the LED module 200. The power source portion 600 includes a power source substrate 610, a plurality of electronic components 620, and an electric wire 630.

The power source substrate 610, for example, which contains glass composite cooper foil multi-layer plate, is circular in shape. As illustrated in FIG. 2, a lower surface of the power source substrate 610 has installed the electronic components 620. The power source substrate 610 is disposed in a manner of obstructing the opening 521 of the spacer 520 of the heat dissipation component 500.

The power source substrate 610 has four heat dissipation through holes 611 formed thereon. Each of the heat dissipation through holes 611 is formed on a peripheral area of the power source substrate 610. The heat dissipation through holes 611 are disposed on a circumferential direction (the same as a circumferential direction of the circular portion 301 of the flexible circuit substrate 300) of the power source substrate 610 by using an interval of 90°. The heat dissipation through holes 421 of the heat conductive bracket 400 and the heat dissipation through holes 611 of the power source substrate 610 are disposed on the same position.

The electronic components 620 has a function of transforming the commercial AC power source of 100 V to the DC power that is suitable to turn the LED module 200 (the LED chip 201) on. The electronic components 620 include capacitor, resistor, coil, diode, IC (Integrated Circuit) and so on. For example, as illustrated in FIG. 2, the most prominent electronic component 620 located on an approximately central location of the power source accommodating cavity 512 is a capacitor.

The electric wire 630 is used to conduct the DC power from the electronic components 620 to the flexible circuit substrate 300. The electric wire 630, from the power source substrate 610, passes the wiring through hole 411 of the heat conductive bracket 400 and reaches the flexible circuit substrate 300.

The bulb connector 800 is a part that is used to install on a lighting appliance used for a general bulb according to the JIS standard. The bulb connector 800 is constituted to satisfy the E17 and E26 standards defined in the JIS standard. The bulb connector 800 connects to the power source portion 600 through the electric wire.

The globe 700 is used to protect the LED module 200, for example, which contains transparent resin. As illustrated in FIGS. 1-6, the globe 700 has a cylinder portion 701, a dome portion 702, a flange portion 703, an inserted portion 704, an opening 721, and a top 722. The opening 721 is used to guide the heat conductive bracket 400 to an interior of the globe 700. The top 722 is located on the opposite side from the opening 721. The cylinder portion 701 is located on the same side as the opening 721. In the present embodiment, a top end of the cylinder portion 701 shown in FIG. 2 is located on an upside that is higher than the top plate 401 of the heat conductive bracket 400 about 10 mm. The dome portion 702 connects to the cylinder portion 701, and a part of which becomes the top 722. The flange portion 703 is a ring-shaped protrusion. The inserted portion 704 is inserted into a groove formed on the heat dissipation component 500, thereby fixing the globe 700 relative to the heat dissipation component 500.

An inside portion of the globe 700 has a plurality of strip bulging portions 711 formed thereon. The strip bulging portion 711 extends from the opening 721 to the top 722 and has a partial-circle shaped cross-section. In the present embodiment, the strip bulging portions 711 are adjacent to each other, thereby forming a plurality of V-grooves 712 on the inside portion of the globe 700. An outside portion of the globe 700 is set to a smooth surface.

The functions of the LED light bulb 101 are described below.

According to the present embodiment, the globe 700 has a concave-convex part. While the light emitted from the LED modules 200 penetrates the concave-convex part of the globe 700, the entire globe 700 in uniform luminescence cannot be observed from the outside of the globe 700, but the globe intermixed the bright and dark portions can be observed.

Consequently, it is capable of allowing the LED light bulb 101 to have the glitter sense, thereby providing the gorgeous and artistic impressions.

By using the strip bulging portions 711 to constitute the concave-convex part, it can prevent the globe 700 from becoming an appearance of intermixing the bright and dark portions, thereby forming a different appearance that the bright and dark portions are disposed suitably and repeatedly. By allowing the strip bulging portion 711 to have a partial-circle shaped cross-section, the strip bulging portion 711 shows the so-called lens effect. The phenomenon is suitable to form the obviously bright portion on the globe 700 and can enhance the glitter sense further. By allowing the strip bulging portions 711 to dispose adjacent to each other, the V-grooves 712 are formed on the globe 700. The V-grooves 712 forms the obviously dark portion on the globe 700, thereby the glitter sense becomes obvious. By setting the outer surface of the globe 700 to the smooth surface, it can prevent the dust from being heaped on the globe 700.

By the constitutions of setting the heat conductive bracket 400 to have the top plate 401 and the first cylinder portion 402 and allowing the cylinder portion 701 of the globe 700 to surround the top plate 401 and the first cylinder portion 402, the entire cylinder portion 701 can form an appearance that makes people to generate the glitter sense. In order to enhance the glitter sense, it is preferably to let the top end of the cylinder portion 701 be located on a position that is higher than the top plate 401.

By disposing the first insulation ring 351, it can prevent a short circuit between the first connection portion 311 of the flexible circuit substrate 300 and the heat conductive bracket 400 from occurring.

By disposing the non-carrier cylinder portion 405, the LED modules 200 can be disposed on a position near the center of the globe 700. In the present embodiment, a divergence angle of the LED module 200 is around 120°. By disposing the non-carrier cylinder portion 405 and the base cylinder portion 406, the flange plate 430 of the heat conductive bracket 400 can be disposed on a position that is more outside than the outer edge of the divergence angle of the LED module 200 which is disposed on the bottom. Consequently, it can prevent the light emitted from the LED module 200 form being unreasonably sheltered by the flange plate 430, thereby the brightness of the LED light bulb 101 can be enhanced.

By disposing the heat dissipation through holes 421, 611, the heat generated from the LED modules 200 can be dissipated via the through holes. In the present embodiment, the counterbore 432 and the heat dissipation through hole 421 can be formed at a time through the drill machining used to form the counterbore 432 that allows the screw 441 to sink.

Figure 9:
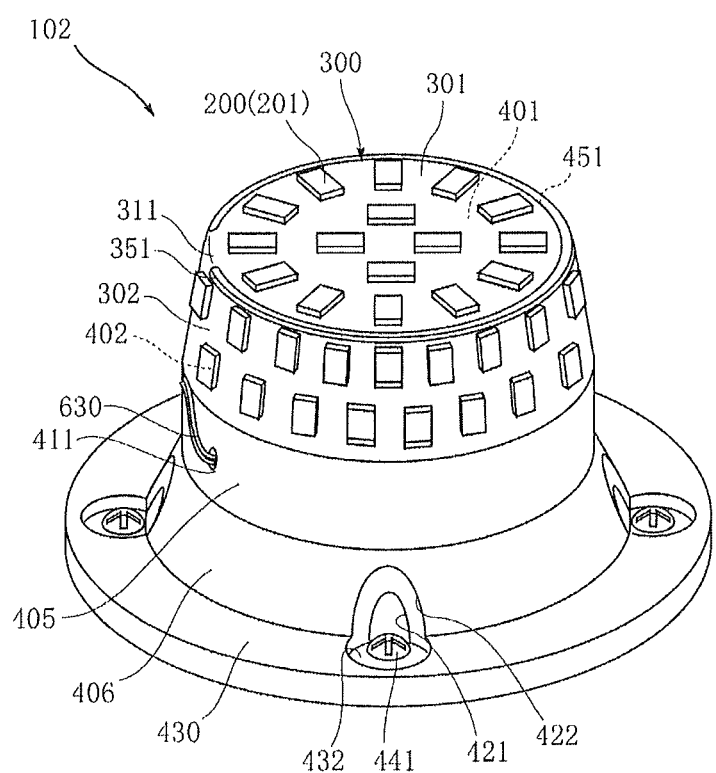
FIG. 9 is a perspective view of a heat conductive bracket of a LED light bulb according to a second embodiment of the present invention.
Figure 10:
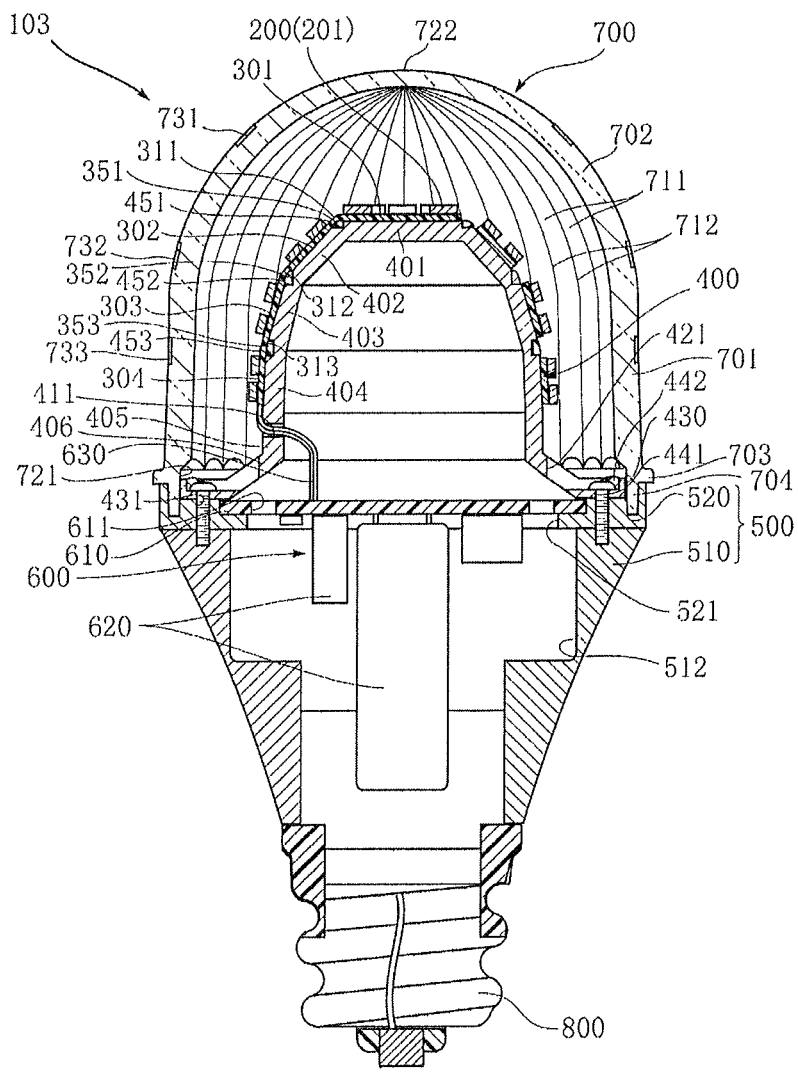
FIG. 10 is a sectional view of a LED light bulb according to a third embodiment of the present invention.
Figure 11:
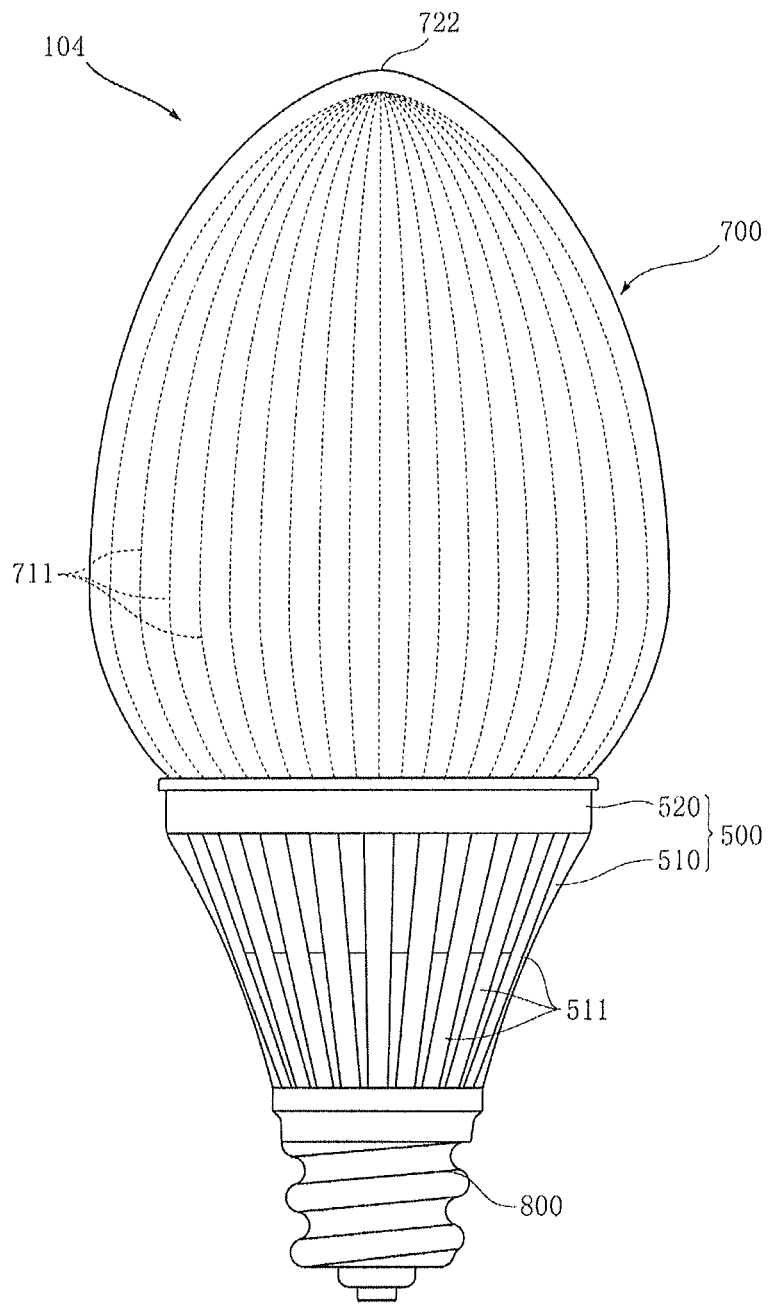
FIG. 11 is a front elevation view of a LED light bulb according to a fourth embodiment of the present invention.
Figure 12:
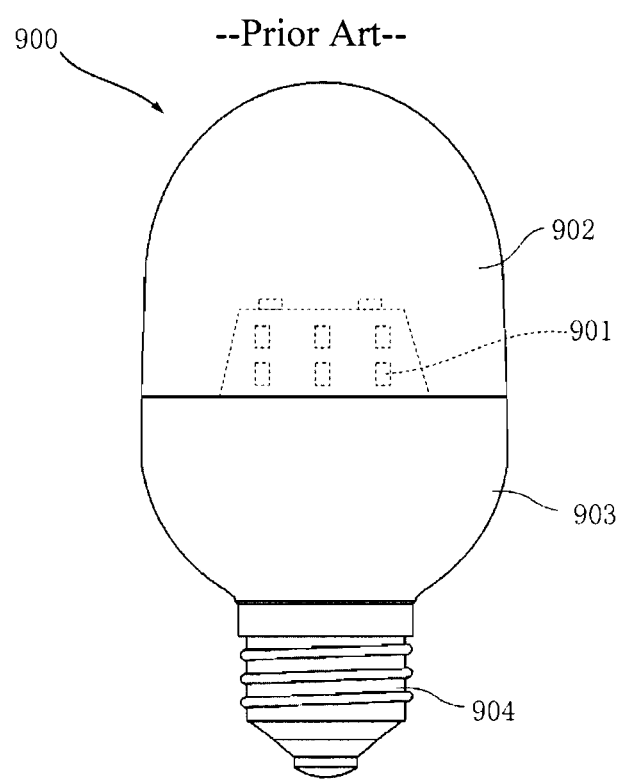
FIG. 12 is a front elevation view illustrating an example of the conventional LED light bulb.

FIGS. 9-11 illustrate the LED light bulbs according to the other embodiments of the present invention. In these embodiments, the same element will be denoted by a same symbol, and the repeat descriptions for them will be omitted.

FIG. 9 illustrates a LED light bulb according to a second embodiment of the present invention. The difference between the LED light bulb 102 of the present embodiment and that of the above embodiment is the disposition of the LED modules 200 that are installed on the first strip arc portion 302. In the present embodiment, the LED modules 200 installed on the first strip arc portion 302 are disposed in a staggered arrangement.

According to this embodiment, it can make the LED light bulb 102 become the gorgeous and artistic appearance. The LED modules 200 disposed in a staggered arrangement are suitable to enhance the glitter sense.

FIG. 10 illustrates a LED light bulb according to a third embodiment of the present invention. The difference between the LED light bulb 103 of the present embodiment and that of the above embodiment is the constitution of the flexible circuit substrate 300 and the heat conductive bracket 400.

The heat conductive bracket 400 has a second cylinder portion 403 connected to an underside of the first cylinder portion 402 and a third cylinder portion 404. The first to third cylinder portions 402-404 are conical in shape and their diameters become increasingly smaller from the underside toward the upside. The inclination of the first cylinder portion 402 located on the top is steepest and that of the third cylinder portion 404 located on the bottom is gentlest. A second groove 452 is formed between the surface of the first cylinder portion 402 and a surface of the second cylinder portion 403. A second insulation ring 352 is disposed in the second groove 452. A third groove 453 is formed between the surface of the second cylinder portion 403 and a surface of the third cylinder portion 404. A third insulation ring 353 is disposed in the third groove 453.

The flexible circuit substrate 300 has a second strip arc portion 303 with a shape similar to the first strip arc portion 302 and a third strip arc portion 304. The second and third strip arc portions 303, 304 are installed on the second and third cylinder portions 403, 404, respectively. The first strip arc portion 302 connects to the second strip arc portion 303 through a second connection portion 312. The second strip arc portion 303 connects to the third strip arc portion 304 through a third connection portion 313. The second insulation ring 352 is inserted between the second connection portion 312 and the heat conductive bracket 400. The third insulation ring 353 is inserted between the third connection portion 313 and the heat conductive bracket 400.

The globe 700 has a first diffusion-penetration portion 731, a second diffusion-penetration portion 732, and a third diffusion-penetration portion 733, which are formed thereon. The first, second, and third diffusion-penetration portions 731, 732, 733 are formed on a ring-shaped part of the globe 700 and have a shape that allows the light emitted form the LED module 200 to diffuse partially. For example, they can be formed by performing a shot blast process on a partial surface of the globe 700 or using a method that makes a corresponding surface of a mold (no shown in the drawings) used to form the globe 700 to become a rough surface beforehand. The first diffusion-penetration portion 731 is located on a position facing a boundary between the circular portion 301 and the first strip arc portion 302. The second diffusion-penetration portion 732 is located on a position facing a boundary between the first strip arc portion 302 and the second strip arc portion 303. The third diffusion-penetration portion 733 is located on a position facing a boundary between the second strip arc portion 303 and the third strip arc portion 304. In addition, the first, second, and third diffusion-penetration portions 731, 732, 733 can be formed on the inside portion of the globe 700, or may also be disposed by forming a semi-transparent resin with an ivory color on a part of the globe 700.

By setting the heat conductive bracket 400 to have a multi-section shape, it can enable the outline of the heat conductive bracket 400 to follow the shape of the globe 700 further. Consequently, the bright portion of the globe 700 becomes brighter, thereby being suitable to enhance the glitter sense. By disposing the first, second, and third diffusion-penetration portions 731, 732, 733, it can prevent a shape-discontinuous portion of the heat conductive bracket 400 from becoming the undesired dark portion to appear on the appearance of the globe 700.

FIG. 11 illustrates a LED light bulb according to a fourth embodiment of the present invention. The difference between the LED light bulb 104 of the present embodiment and that of the above embodiment is the shape of the globe 700. In the present embodiment, a diameter near a lower portion of the globe 700 is maximal and the top 722 has a pointier shape. The globe 700 can be associated with a shape of fire of a candle or water drop.

By using this embodiment, it can enable the LED light bulb 104 to have the gorgeous and artistic appearance.

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

What is claimed is:

1. A LED light bulb, comprising:
    a plurality of LED chips;
    a globe, covering the LED chips and allowing the light emitted from the LED chips to penetrate; and
    a bulb connector,
    wherein the globe has a top located on an opposite side from the bulb connector, at least one portion of a light penetrating part of the globe has a plurality of strip bulging portions formed on an inner surface of the globe and extending from the top of the globe toward the bulb connector, and
    wherein each strip bulging portion forms a partial-circle shaped protrusion extending toward the LED chips, and a sharp V groove is formed between each two adjacent strip bulging portions, thereby allowing sharp V grooves and partial-circle shaped protrusions to be formed alternately on the inner surface of the globe.

2. The LED light bulb as claimed in claim 1, wherein the globe has an opening located on the same side as the bulb connector, and the strip bulging portions extend from the opening to the top.

3. The LED light bulb as claimed in claim 2, wherein the strip bulging portions are adjacent to each other.

4. The LED light bulb as claimed in claim 1, wherein each of the strip bulging portions has a partial-circle shaped cross-section.

5. The LED light bulb as claimed in claim 1, wherein the concave-convex part is located on an inner side of the globe.

6. The LED light bulb as claimed in claim 1, further comprising a heat conductive bracket supporting the LED chips and a heat dissipation component on which the heat conductive bracket and the bulb connector are installed opposite to each other.

7. The LED light bulb as claimed in claim 6, wherein the heat conductive bracket has a top plate and a first cylinder portion connected to the top plate.

8. The LED light bulb as claimed in claim 7, wherein a diameter of the first cylinder portion becomes increasingly smaller toward the top plate.

9. The LED light bulb as claimed in claim 8, further comprising a flexible circuit substrate that carries the LED chips and is installed on the heat conductive bracket.

10. The LED light bulb as claimed in claim 9, wherein the flexible circuit substrate has a circular portion to be installed on the top plate.

11. The LED light bulb as claimed in claim 10, wherein the flexible circuit substrate has a first strip arc portion to be installed on the first cylinder portion.

12. The LED light bulb as claimed in claim 11, wherein the heat conductive bracket has a first groove located between a surface of the top plate and a surface of the first cylinder portion; the flexible circuit substrate has a first connection portion connected to the circular portion and the first strip arc portion, and a first insulation ring disposed in the first groove and located between the first connection portion of the flexible circuit substrate and the heat conductive bracket.

13. The LED light bulb as claimed in claim 11, wherein the globe has a first diffusion-penetration portion formed on a position facing a boundary between the top plate and the first cylinder portion, which allows the light emitted from the LED chips to diffuse and penetrate.

14. The LED light bulb as claimed in claim 12, wherein the globe has a first diffusion-penetration portion formed on a position facing a boundary between the top plate and the first cylinder portion, which allows the light emitted from the LED chips to diffuse and penetrate.

15. The LED light bulb as claimed in claim 11, wherein the heat conductive bracket has a second cylinder portion connected to the opposite side of first cylinder portion from the top plate, and a diameter of the second cylinder portion becomes increasingly smaller toward the first cylinder portion; the flexible circuit substrate has a second strip arc portion installed on the second cylinder portion.

16. The LED light bulb as claimed in claim 11, wherein the heat conductive bracket has a circular flange plate installed on the heat dissipation component.

17. The LED light bulb as claimed in claim 16, wherein the heat conductive bracket has a non-carrier cylinder portion located between the flange plate and the first cylinder portion, and the flexible circuit substrate is not installed thereon.

18. The LED light bulb as claimed in claim 17, wherein the heat conductive bracket has a base cylinder portion located between the flange plate and the non-carrier cylinder portion, and a diameter of the base cylinder portion becomes increasingly smaller from the flange plate toward the non-carrier cylinder portion.

19. The LED light bulb as claimed in claim 11, further comprising a plurality of LED modules installed on the flexible circuit substrate, each of which comprises the LED chip.

20. The LED light bulb as claimed in claim 19, wherein, in the plurality of LED modules, the LED modules installed on the first strip arc portion are disposed in multi-line.

21. The LED light bulb as claimed in claim 20, wherein, in the plurality of LED modules, the LED modules installed on the first strip arc portion are disposed in a staggered arrangement.

22. The LED light bulb as claimed in claim 6, wherein the globe has a cylinder portion surrounded at least one portion of the heat conductive bracket and a dome portion connected to the cylinder portion.

* * * * *